United States Patent
He et al.

(10) Patent No.: US 9,472,416 B2
(45) Date of Patent: Oct. 18, 2016

(54) METHODS OF SURFACE INTERFACE ENGINEERING

(71) Applicant: APPLIED MATERIALS, INC., Santa Clara, CA (US)

(72) Inventors: Jim Zhongyi He, San Jose, CA (US); Ping Han Hsieh, San Jose, CA (US); Melitta Manyin Hon, San Jose, CA (US); Chun Yan, San Jose, CA (US); Xuefeng Hua, Forster City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/506,058

(22) Filed: Oct. 3, 2014

(65) Prior Publication Data
US 2015/0111389 A1 Apr. 23, 2015

Related U.S. Application Data

(60) Provisional application No. 61/893,868, filed on Oct. 21, 2013.

(51) Int. Cl.
| | |
|---|---|
| *H01L 21/302* | (2006.01) |
| *H01L 21/311* | (2006.01) |
| *H01L 21/3213* | (2006.01) |
| *H01L 21/02* | (2006.01) |

(52) U.S. Cl.
CPC ... *H01L 21/31116* (2013.01); *H01L 21/02057* (2013.01); *H01L 21/32132* (2013.01); *H01L 21/32137* (2013.01)

(58) Field of Classification Search
CPC .................. H01L 21/3065; H01L 21/31116; H01L 21/32132; H01L 21/32137
USPC ................................ 438/723, 727, 735, 743
See application file for complete search history.

(56) References Cited

U.S. PATENT DOCUMENTS

| | | |
|---|---|---|
| 5,268,069 A | 12/1993 | Chapple-Sokol et al. |
| 7,718,538 B2 | 5/2010 | Kim et al. |
| 7,737,042 B2 | 6/2010 | Kim et al. |
| 7,771,606 B2 | 8/2010 | Kim et al. |
| 8,889,563 B2 | 11/2014 | Lim |
| 2007/0123051 A1 | 5/2007 | Arghavani et al. |

(Continued)

FOREIGN PATENT DOCUMENTS

JP 2012-186221 9/2012

OTHER PUBLICATIONS

International Search Report and Written Opinion mailed Feb. 26, 2015 for PCT Application No. PCT/US2014/059434.

*Primary Examiner* — Binh X Tran
(74) *Attorney, Agent, or Firm* — Moser Taboada; Alan Taboada

(57) ABSTRACT

Methods for surface interface engineering in semiconductor fabrication are provided herein. In some embodiments, a method of processing a substrate disposed atop a substrate support in a processing volume of a processing chamber includes: generating an ion species from an inductively coupled plasma formed within the processing volume of the processing chamber from a first process gas; exposing a first layer of the substrate to the ion species to form an ammonium fluoride ($NH_4F$) film atop the first layer, wherein the first layer comprises silicon oxide; and heating the substrate to a second temperature at which the ammonium fluoride film reacts with the first layer to selectively etch the silicon oxide.

16 Claims, 4 Drawing Sheets

(56) References Cited

U.S. PATENT DOCUMENTS

| | | | |
|---|---|---|---|
| 2008/0182382 A1* | 7/2008 | Ingle | H01L 21/76232 438/435 |
| 2009/0056745 A1* | 3/2009 | Sun | C11D 7/08 134/3 |
| 2009/0075486 A1 | 3/2009 | Kikuyama et al. | |
| 2009/0275205 A1* | 11/2009 | Kiehlbauch et al. | 438/712 |
| 2009/0284156 A1 | 11/2009 | Banna et al. | |
| 2010/0240218 A1 | 9/2010 | Ugajin | |
| 2010/0261302 A1* | 10/2010 | Rana | H01L 31/0745 438/58 |
| 2011/0065276 A1* | 3/2011 | Ganguly et al. | 438/694 |
| 2011/0177669 A1 | 7/2011 | Lee et al. | |
| 2011/0223755 A1* | 9/2011 | Kao et al. | 438/585 |
| 2011/0250747 A1* | 10/2011 | Son | H01L 21/0206 438/594 |
| 2013/0048605 A1* | 2/2013 | Sapre et al. | 216/51 |
| 2014/0017909 A1 | 1/2014 | Kato | |

\* cited by examiner

METHODS OF SURFACE INTERFACE ENGINEERING

CROSS-REFERENCE TO RELATED APPLICATIONS

This application claims benefit of U.S. provisional patent application Ser. No. 61/893,868, filed Oct. 21, 2013, which is herein incorporated by reference in its entirety.

FIELD

Embodiments of the present disclosure generally relate to semiconductor substrate processing, and more specifically, to methods of surface interface engineering in semiconductor fabrication.

BACKGROUND

The inventors have observed that interfacial engineering (e.g., removing contaminants, modifying surface morphology, restructuring lattices, or the like) is advantageous for sub-10 nm node devices. Many key processes, such as epitaxial film growth, metallization, etc., rely on the quality of the interface to enhance device performance. To make a high quality interface, not only are chemical reactions necessary to clean the surface, but also some physical treatment like physically displacing the lattice to smooth the surface are critical to device fabrication. For example, surface oxidation always occurs on silicon during air exposure, and highly selective native oxide removal is desired to minimize silicon loss. However, the interface is typically a mixture of many elements such as carbon, nitrogen, and the like, and is often rough.

The inventors have further observed that a pure oxide removal process is not sufficient to improve the interface quality. For example, a remote $NH_3/NF_3$ plasma provides highly selective $SiO_2/Si$ removal by forming $NH_4F$ which is easy to react with Si—O bonds at room temperature, but not with Si—Si bonds. The polymer $NH_4F$—$SiO_2$ can be sublimated when sufficiently heated. However, because $NH_4F$ only sticks to Si—O, when the interface is silicon rich, it takes a long time to remove oxygen from surface, and the $NH_4F$ would also remove substantial amounts of true silicon oxide which has 1:2 Si to O ratio. This is problematic because an $SiO_2$ liner is often utilized to protect the transistor, and if this protective dielectric film is removed, the device can be shorted and yield will drop. Also, in remote plasma processes, many ions are not able to survive to reach the substrate, and so the energy flux incident on the substrate surface is very small, making it extremely difficult to modify the surface morphology with a remote plasma. Furthermore, the remote plasma removal is typically isotropic and strongly dependent on the geometric receiving angle of reactants. For example, more oxide removal is expected at the feature top than at the bottom due to the limited species delivery to the feature bottom. This problem is exacerbated when the feature is tiny, for example in sub-10 nm node devices.

Thus, the inventors have provided improved methods for surface interface engineering in semiconductor fabrication.

SUMMARY

Methods for surface interface engineering in semiconductor fabrication are provided herein. In some embodiments, a method of processing a substrate disposed atop a substrate support in a processing volume of a processing chamber includes: generating an ion species from an inductively coupled plasma formed within the processing volume of the processing chamber from a first process gas; exposing a first layer of the substrate to the ion species to form an ammonium fluoride ($NH_4F$) film atop the first layer, wherein the first layer comprises silicon oxide; and heating the substrate to a second temperature at which the ammonium fluoride film reacts with the first layer to selectively etch the silicon oxide.

In some embodiments, a method of processing a substrate disposed atop a substrate support in a processing volume of a processing chamber includes: generating an ion species from an inductively coupled plasma formed within the processing volume of the processing chamber from a first process gas comprising ammonia (NH3), nitrogen fluoride (NF3), and an inert gas; exposing a first layer of the substrate to the ion species to form an ammonium fluoride (NH4F) film atop the first layer, wherein the first layer comprises silicon oxide; and heating the substrate to a second temperature at which the ammonium fluoride film reacts with the first layer to selectively etch the silicon oxide.

In some embodiments, a computer readable medium, having instructions stored thereon which, when executed, cause a process chamber to perform a method of processing a substrate disposed atop a substrate support in a processing volume of a processing chamber. The method may include any of the embodiments disclosed herein.

Other embodiments and variations of the present disclosure are discussed below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
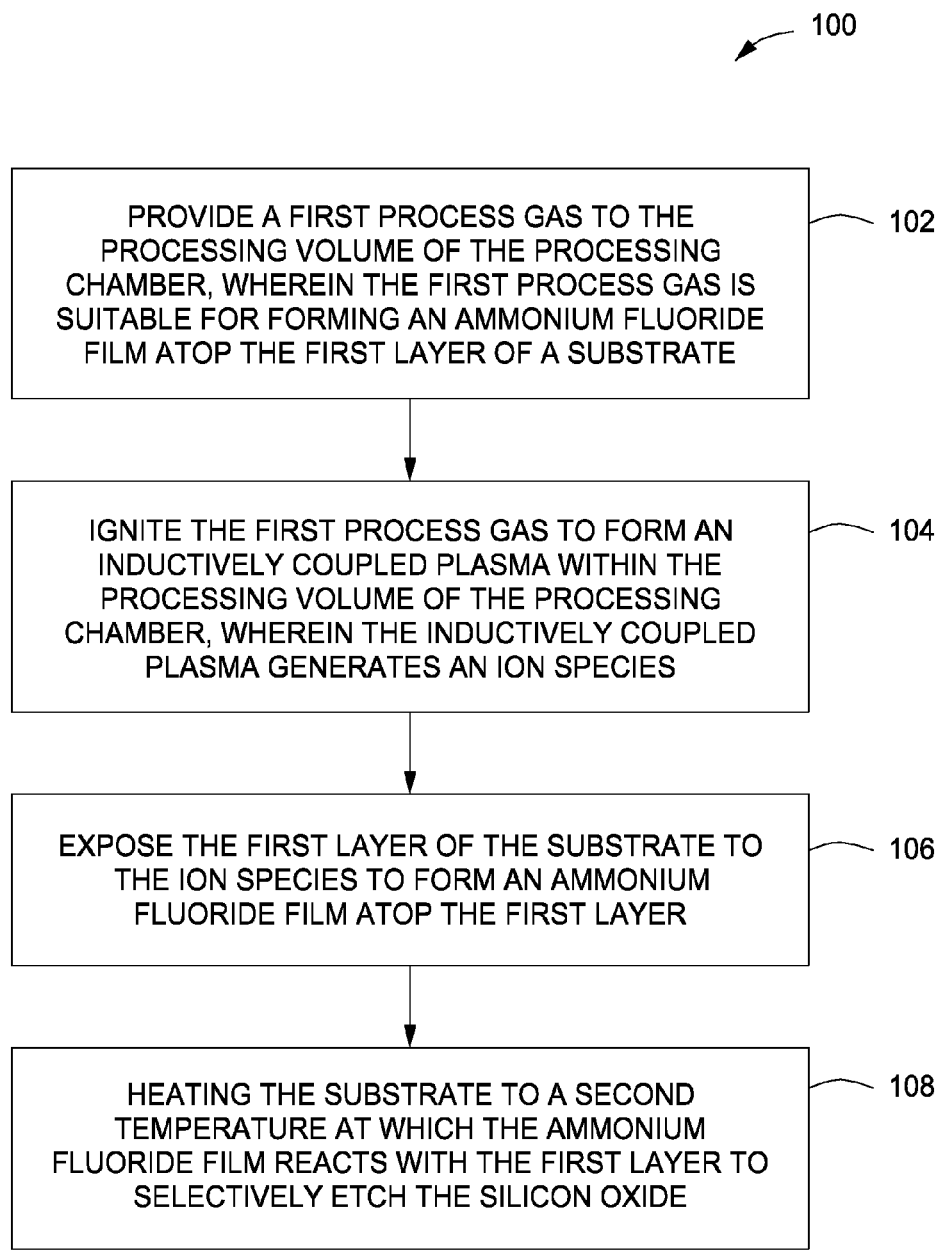
FIG. 1 is a flow diagram of a method for selective etching in semiconductor fabrication in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure provide methods for surface interface engineering in semiconductor fabrication. Embodiments of the inventive process described herein advantageously allow ion species from an $NH_3/NF_3$ plasma to reach a substrate in order to chemically treat an interface layer to clean the surface of, for example, native oxide layer and in order to physically modify an interface layer to, for example, smooth the surface.

FIG. 1 is a flow diagram of a process 100 for processing a substrate in accordance with some embodiments of the present disclosure. FIGS. 2A-2H are illustrative cross-sectional views of a substrate during different stages of the processing sequence of FIG. 1 in accordance with some embodiments of the present disclosure. Without limitation of the scope of the present disclosure, embodiments of the inventive processes disclosed herein can be advantageously used for pre-clean for epitaxial deposition, metal deposition, and surface re-engineering in semiconductor manufacturing.

Figure 2A:
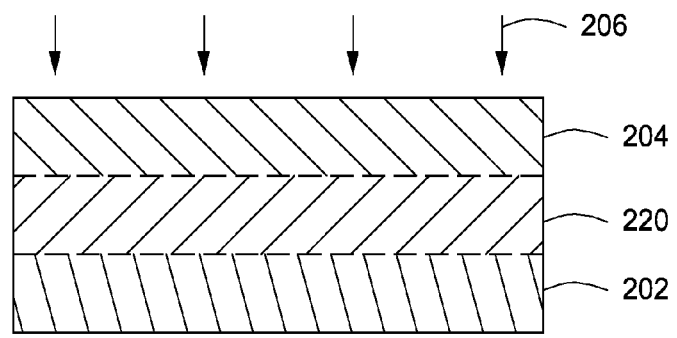
FIGS. 2A-2H are illustrative cross-sectional views of a substrate during different stages of the method of FIG. 1 in accordance with some embodiments of the present disclosure.
Figure 2B:
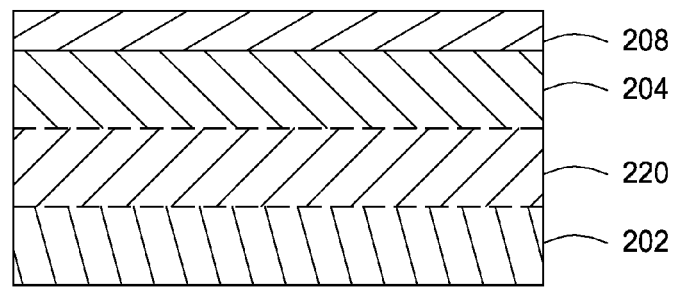
Figure 2C:
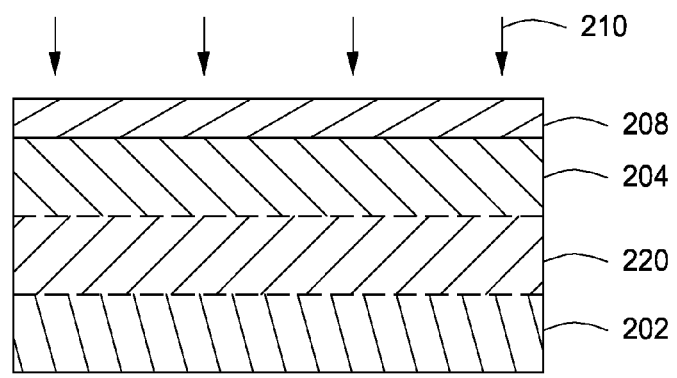
Figure 2D:
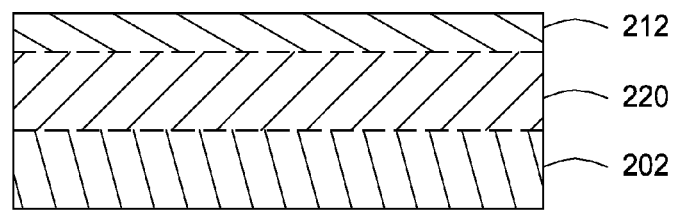
Figure 2E:
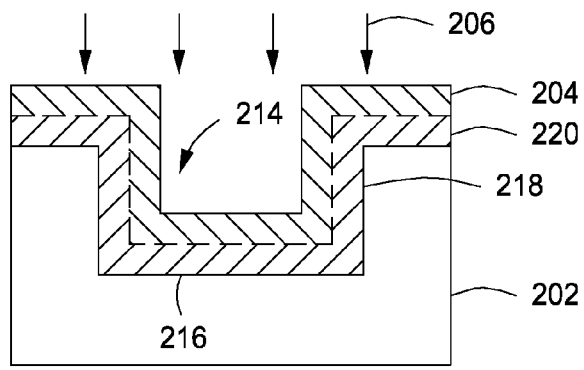

A substrate 202 (as depicted in FIGS. 2A and 2E) having a first layer 204 disposed on the substrate 202, is disposed atop a substrate support in a processing volume of processing chamber. The processing chamber may be any apparatus suitable for processing semiconductor substrates in accordance with embodiments of the present disclosure, such as the processing chamber discussed below with respect to FIG. 3. The substrate 202 may be any suitable substrate, such as a doped or un-doped silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 202 may be a semiconductor wafer. In some embodiments, as depicted in FIG. 2E, the substrate 202 may include a first feature 214 disposed therein. In some embodiments, the first feature 214 comprises a bottom surface 216 and one or more sidewalls 218. The first feature 214 may be a trench, a via, a dual damascene structure, a partially completed microelectronic device, or the like. In some embodiments, the first feature may have an aspect ratio of about 1:1 to about 20:1, for example at least about 10:1.

In some embodiments, the first layer 204 is any suitable layer to be removed and where removal may result in undesired contaminants on the surface of the substrate 202. For example, the first layer 204 may include a native oxide layer, a deposited oxide layer, a patterned layer, a photoresist, a masking layer, or the like. In some embodiments, the first layer 204 is an oxide layer. For example, the first layer 204 may include silicon oxide ($SiO_x$). In some embodiments, the first layer is silicon dioxide ($SiO_2$). In some embodiments, the first layer may also comprise one or more of carbon and nitrogen. In some embodiments, one or more intervening layers 220, such as a polycrystalline silicon layer and/or a tunnel oxide layer, may be disposed between the first layer 204 and the substrate 202.

The process 100 generally begins at 102 where a first process gas is provided to the processing volume of the processing chamber. The first process gas is a gas or a mixture of gases suitable for forming an ammonium fluoride ($NH_4F$) film atop the substrate 202. In some embodiments, the first process gas is a mixture of ammonia ($NH_3$) and nitrogen trifluoride ($NF_3$). The amount of each gas introduced into the processing chamber is variable and may be adjusted to accommodate, for example, the thickness of the oxide layer to be removed. In some embodiments, the ratio of ammonia ($NH_3$) to nitrogen trifluoride ($NF_3$) is about 1:1 to about 100:1, for example, about 5:1. The combination of ammonia and nitrogen trifluoride advantageously removes silicon oxide with selectivity over silicon. Increasing the amount of nitrogen trifluoride in the first process gas advantageously increases the etch rate of the oxide layer to be removed. In some embodiments, the first process gas further comprises an inert gas such as argon, helium, nitrogen, or mixtures thereof. In some embodiments, the process gas comprises greater than about 90% inert gas with the balance being a mixture of ammonia and nitrogen trifluoride.

Next, at 104, the first process gas is ignited to form an inductively coupled plasma that generates ion species 206 as depicted in FIGS. 2A and 2E. The inventors have observed that in a remote plasma process, ions are not able to survive the long travel distance to reach the substrate surface, and thus are unable to provide any surface modification of the substrate. However, the ion species from an inductively coupled plasma are advantageously able to reach the substrate in order to modify the surface morphology of the substrate. In some embodiments, the first process gas may be ignited into an inductively coupled plasma by coupling radio frequency (RF) power at a suitable frequency to the process gas within a process chamber under suitable conditions to establish the plasma. In some embodiments, about 200 watts to about 1500 watts of RF power may be provided, for example, at a frequency of about 2 to about 161 MHz. In some embodiments, the plasma can be formed by pulsing RF power at about 300 watts to about 1500 watts at a duty cycle of about 1 to about 99 percent. For example, about 200 watts of RF power may be pulsed to an inductively coupled antenna of a process chamber at a duty cycle of about 20 percent to ignite and maintain the plasma. In some embodiments, pulsing the RF plasma power advantageously reduces the plasma density which reduces plasma damage to the substrate. The plasma energy dissociates the ammonia and nitrogen trifluoride gases into reactive species that combine to form a highly reactive ammonia fluoride ($NH_4F$) compound.

Additional process parameters may be utilized to promote plasma ignition and stability. For example, in some embodiments, the process chamber may be maintained at a temperature of between about 30 to about 85 degrees Celsius during plasma ignition. Additionally, in some embodiments, the process chamber may be maintained at a pressure of between about 10 to about 1000 mTorr. In some embodiments, the pressure in the process chamber is maintained at a high pressure, for example above about 400 mTorr to allow the dissociated ammonia and nitrogen trifluoride gases to recombine to form ammonia fluoride. In some embodiments, the process chamber can be maintained at a low pressure, for example, less than about 100 mTorr which maintains the ammonia and nitrogen trifluoride gases in a dissociated state to increase the etch rate of silicon vs. silicon oxide.

Figure 2F:
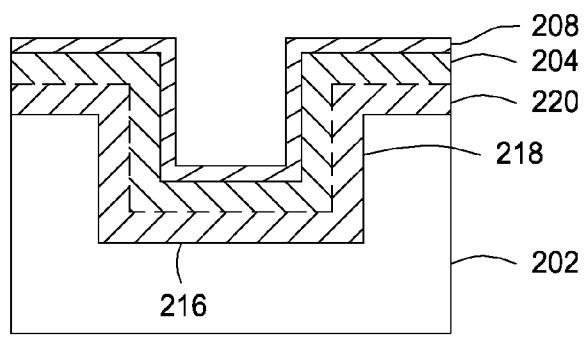

Next, at 106, the substrate 202 is exposed to the ion species 206 to form an ammonium fluoride film 208 atop the first layer 204 as depicted in FIGS. 2B and 2F. In some embodiments, the substrate 202 is maintained at a first temperature of less than about 50 degrees Celsius to promote formation of the ammonium fluoride film atop the first layer 204 of the substrate 202. Not wishing to be bound by theory, it is believed that the ammonium fluoride reacts with the silicon oxide surface to form ammonium hexafluorosilicate $(NH_4)_2SiF_6$, $NH_3$, and $H_2O$ products. The $NH_3$ and $H_2O$ are vapors at processing conditions and evacuated from the processing chamber. A thin film of $(NH_4)_2SiF_6$ is left behind on the surface of the first layer 204.

In some embodiments, to facilitate the directing of ions towards the substrate 202 a bias power may be provided to the substrate 202 via a substrate support disposed in a process chamber, for example, such as discussed below with respect to FIG. 3. In some embodiments, a bias power of about 15 watts to about 1000 watts may be provided, for example, at a frequency of about 400 kHz to about 60 MHz to the substrate. In some embodiments, the bias power may be pulsed at a pulse frequency of about 10 Hz to about 10 kHz at a duty cycle of about 1 to about 99 percent. Application of a bias power to the substrate advantageously facilitates control of the etch selectivity, thus facilitating achievement of necessary surface or interface modification, such as making the surface smoother. Application of a bias power to the substrate advantageously further allows for the control over etch directionality, for example to direct ions toward only the surface and bottom of a feature. For example, directional removal of $SiO_2$ has been demonstrated by the inventors in fine features (e.g., below 15 nm trenches) by using bias in connection with embodiments of the present disclosure.

Figure 2G:
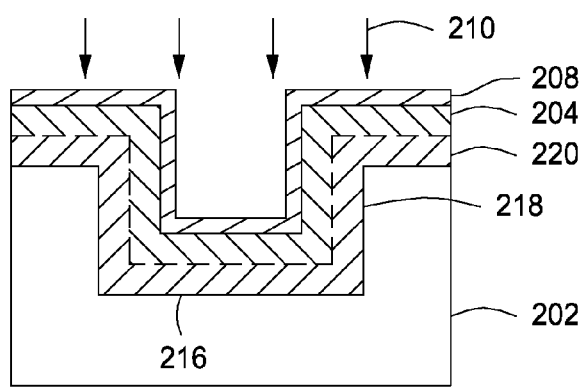

Next, at 108, the substrate 202 is exposed to heat energy 210, as depicted in FIGS. 2C and 2G, to raise the temperature of the substrate 202 to a second temperature at which the ammonium fluoride film 208 reacts with the first layer 204 to selectively etch silicon oxide from the first layer 204. The second temperature may be any temperature sufficient to dissociate or sublimate the thin film of $(NH_4)_2SiF_6$ into volatile $SiF_4$, $NH_3$, and HF products. The second temperature may be constrained by hardware limitations, materials limitations, and/or application limitations (e.g., thermal budget or maximum temperature limits to prevent device or structure damage). In some embodiments, the substrate is heated to a second temperature of about 100 to about 150 degrees Celsius, or in some embodiments greater than about 100 degrees Celsius, to vaporize the reacted ammonium fluoride layer.

In some embodiments, the selectivity of silicon oxide to silicon is about 1:1 to about 30:1, for example, at least about 20:1, or in some embodiments, greater than about 30:1. In some embodiments, the selectivity of silicon oxide to silicon nitride is about 1:1 to about 10:1, or in some embodiments greater than about 10:1.

Figure 2H:
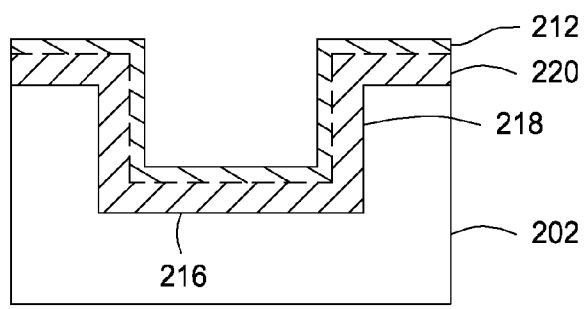

In some embodiments, as depicted in FIGS. 2D and 2H, a second layer 212 may be deposited on the substrate 202. The second layer 212 may comprise one or more of the materials disclosed above for the substrate 202. For example, the second layer 212 may comprise one or more of germanium (Ge), group III-V elements, or alloys formed therefrom, such as gallium arsenide (GaAs), aluminum arsenide (AlAs), indium arsenide (InAs), aluminum antimony (AlSb), Indium antimony (InSb), gallium antimony (GaSb), gallium phosphorus (GaP), aluminum phosphorus (AlP), indium phosphorus (InP) or the like. In some embodiments, the second layer is silicon germanium (SiGe). In some embodiments, the silicon-containing layer is silicon (Si) and the second layer is silicon germanium (SiGe). The second layer 212 may be deposited in any suitable manner, such as by chemical vapor deposition (CVD), atomic layer deposition (ALD), or the like. Upon completion of deposition of the second layer 212 the substrate may continue being processed, as desired, to complete the formation of structures and/or devices thereupon.

In some embodiments, prior to providing a first process gas to the processing volume of the processing chamber, the substrate 202 is pre-treated by providing a second process gas to the processing chamber. The second process gas is an inert gas, such as argon, helium, nitrogen, or the like. The second process gas is ignited to form a plasma within the process chamber. Ions from the second process gas, such as argon ions, physically modify the surface of the first layer, for example by creating dangling bonds, that advantageously allow the ammonium fluoride film to form atop the first layer 204 at temperatures greater than if no pre-treatment were provided. For example, with the pre-treatment described above, the first temperature at which the ammonium fluoride film is formed atop the first layer 204 can be greater than about 50 degrees Celsius, for example about 50 to about 100 degrees Celsius (for example, about 70 degrees Celsius), or in some embodiments greater than about 100 degrees Celsius. The first temperature may be constrained by hardware limitations, materials limitations, and/or application limitations (e.g., thermal budget or maximum temperature limits to prevent device or structure damage).

The processes described herein may be performed in an integrated etch processing system (e.g., a cluster tool) that includes a vacuum transfer chamber having processing chambers coupled thereto that are suitable for etching materials present in the substrate, such as silicon and, optionally, metal, polysilicon, and high-k material layers present in, for example, a gate film stack. The processes described herein may also be performed in other integrated etch processing systems.

Figure 3:
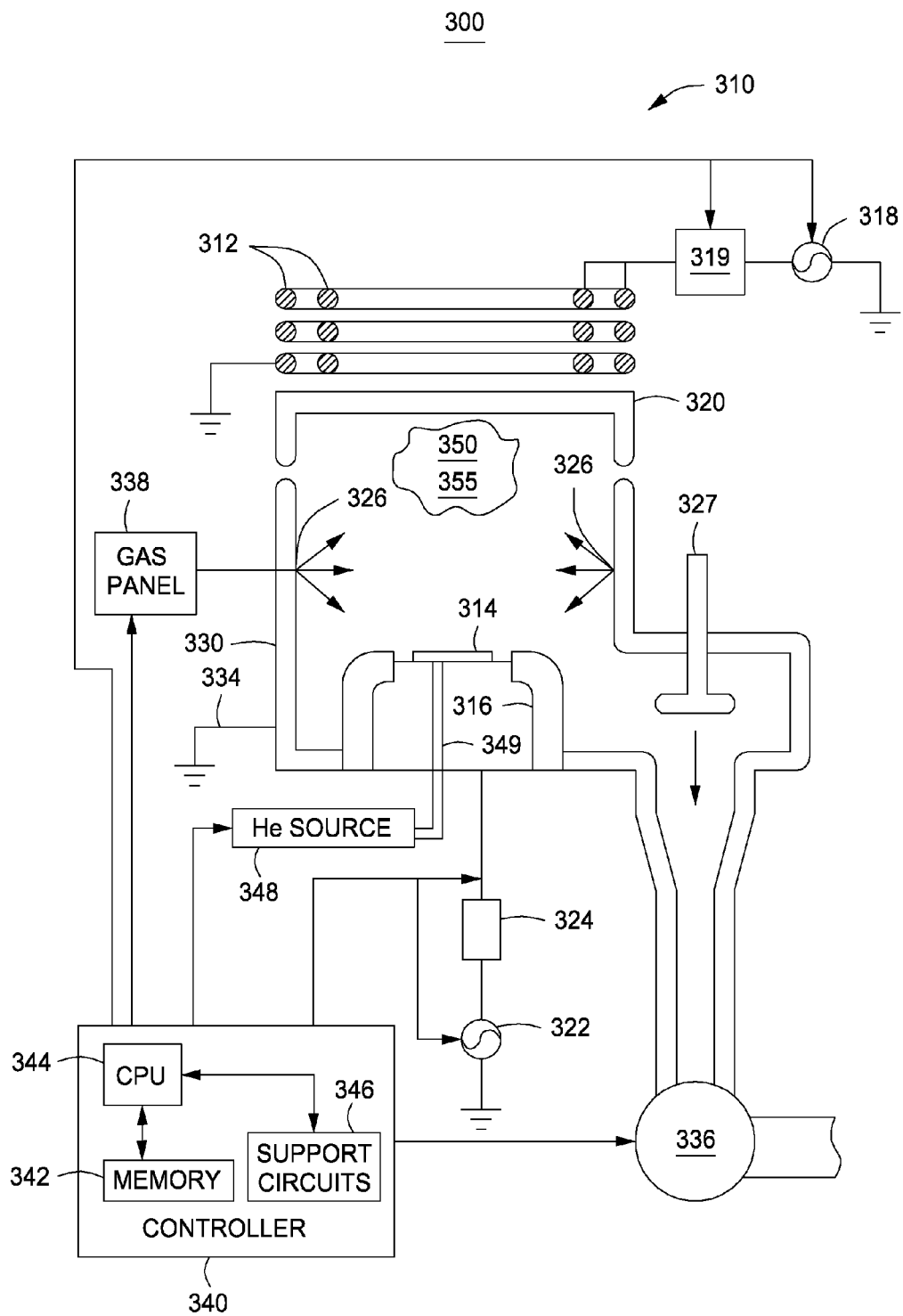
FIG. 3 depicts an etch reactor suitable for performing portions of the present disclosure.

For example, FIG. 3 depicts a schematic diagram of an illustrative etch reactor 300 of the kind that may be used to practice embodiments of the disclosure as discussed herein. The etch reactor 300 may be utilized alone or, more typically, as a processing module of an integrated semiconductor substrate processing system, or cluster tool, such as a CENTURA® integrated semiconductor substrate processing system, available from Applied Materials, Inc. of Santa Clara, Calif. Examples of suitable etch reactors 300 include the ADVANTEDGE™ line of etch reactors (such as the AdvantEdge G3 or the AdvantEdge G5), the DPS® line of etch reactors (such as the DPS®, DPS® II, DPS® AE, DPS® HT, DPS® G3 poly etcher), or other etch reactors, also available from Applied Materials, Inc. Other etch reactors and/or cluster tools may suitably be used as well.

The etch reactor 300 comprises a chamber 310 having a substrate support 316 (cathode) within a conductive body (wall 330), and a controller 340. The chamber 310 may be supplied with a substantially flat dielectric ceiling 320. Alternatively, the chamber 310 may have other types of ceilings, e.g., a dome-shaped ceiling. An antenna comprising at least one inductive coil element 312 is disposed above the ceiling 320 (two co-axial inductive coil elements 312 are shown). The inductive coil element 312 is coupled to a plasma power source 318 through a first matching network 319. The plasma power source 318 typically is capable of producing up to 3000 W at a tunable frequency in a range from 50 KHz to 13.56 MHz. The plasma power source 318 may be operable in a continuous wave (CW) or pulsed mode. When in pulse mode, the plasma power source 318 may be pulsed at a pulse frequency of up to about 100 KHz, or in some embodiments, between about 100 Hz to about 100 KHz. The plasma power source 318 may be operated at a duty cycle (e.g., the percentage of on time during the total of on time and off time in a given cycle) of between about 10% and about 90%.

The substrate support 316 is coupled, through a second matching network 324, to a biasing power source 322. The biasing power source 322 generally is capable of producing up to 1500 W at a frequency of approximately 13.56 MHz. The biasing power may be either continuous or pulsed power. In other embodiments, the biasing power source 322 may be a DC or pulsed DC source. The biasing power source 322 may be operable in a continuous wave (CW) or pulsed mode. When in pulse mode, the biasing power source 322 may be pulsed at a pulse frequency of up to about 100 kHz, or in some embodiments, between about 100 Hz to about 100 KHz. The biasing power source 322 may be operated at a duty cycle (e.g., the percentage of on time during the total of on time and off time in a given cycle) of between about 10% and about 90%.

A controller 340 comprises a central processing unit (CPU) 344, a memory 342, and support circuits 346 for the CPU 344 and facilitates control of the components of the chamber 310 and, as such, of the etch process, as discussed below in further detail.

In operation, a substrate 314 is placed on the substrate support 316 and process gases are supplied from a gas panel 338 through entry ports 326 and form a gaseous mixture 350. The gaseous mixture 350 is ignited into a plasma 355 in the chamber 310 by applying power from the plasma power source 318 and biasing power source 322 to the inductive coil element 312 and the substrate support 316 (cathode), respectively. The pressure within the interior of the chamber 310 is controlled using a throttle valve 327 and a vacuum pump 336. Typically, the wall 330 is coupled to an electrical ground 334. The temperature of the wall 330 is controlled using liquid-containing conduits (not shown) that run through the wall 330.

The temperature of the substrate 314 is controlled by stabilizing a temperature of the substrate support 316. In one embodiment, the helium gas from a gas source 348 is provided via a gas conduit 349 to channels (not shown) formed in the pedestal surface under the substrate 314. The helium gas is used to facilitate heat transfer between the substrate support 316 and the substrate 314. During processing, the substrate support 316 may be heated by a resistive heater (not shown) within the pedestal to a steady state temperature and then the helium gas facilitates uniform heating of the substrate 314. Using such thermal control, the substrate 314 may be maintained at a temperature of between about 0-650 degrees Celsius.

Other etch chambers may be used to practice the disclosure, including chambers with remote plasma sources, electron cyclotron resonance (ECR) plasma chambers, and the like.

To facilitate control of the process chamber 310 as described above, the controller 340 may be one of any form of general-purpose computer processor that can be used in an industrial setting for controlling various chambers and sub-processors. The memory 342, or computer-readable medium, of the CPU 344 may be one or more of readily available memory such as random access memory (RAM), read only memory (ROM), floppy disk, hard disk, or any other form of digital storage, local or remote. The support circuits 346 are coupled to the CPU 344 for supporting the processor in a conventional manner. These circuits include cache, power supplies, clock circuits, input/output circuitry and subsystems, and the like. The inventive method described herein is generally stored in the memory 342 as a software routine. The software routine may also be stored and/or executed by a second CPU (not shown) that is remotely located from the hardware being controlled by the CPU 344.

The disclosure may be practiced using other semiconductor substrate processing systems wherein the processing parameters may be adjusted to achieve acceptable characteristics by those skilled in the art by utilizing the teachings disclosed herein without departing from the spirit of the disclosure.

While the foregoing is directed to embodiments of the present disclosure, other and further embodiments of the disclosure may be devised without departing from the basic scope thereof.

The invention claimed is:

1. A method of processing a substrate disposed atop a substrate support in a processing volume of a processing chamber, the method comprising:
    generating an ion species from an inductively coupled plasma formed within the processing volume of the processing chamber from a first process gas, wherein the inductively coupled plasma is formed in the same processing volume as the substrate without a chamber component disposed between the inductively coupled plasma and the substrate, wherein the inductively coupled plasma is formed by providing radio frequency (RF) power to ignite the first process gas, and wherein the RF power is pulsed to pulse the plasma;
    exposing a first layer of the substrate to the ion species to form an ammonium fluoride ($NH_4F$) film atop the first layer, wherein the first layer comprises silicon oxide; and
    heating the substrate to a second temperature at which the ammonium fluoride film reacts with the first layer to selectively etch the silicon oxide.

2. The method of claim 1, wherein the first process gas comprises ammonia ($NH_3$) and nitrogen trifluoride ($NF_3$).

3. The method of claim 1, wherein the first process gas further comprises an inert gas.

4. The method of claim 1, wherein the substrate further comprises silicon and wherein the ammonium fluoride film etches the silicon oxide with a selectivity of silicon oxide to silicon of at least about 20:1.

5. The method of claim 1, wherein exposing the first layer of the substrate to the ion species further comprises maintaining the substrate at a first temperature of less than about 50 degrees Celsius to form the ammonium fluoride film atop the first layer.

6. The method of claim 1, wherein the second temperature is greater than about 100 degrees Celsius to vaporize the reacted ammonium fluoride film.

7. The method of claim 1, wherein the substrate comprises one or more features disposed in the first layer, wherein the features include a bottom surface and one or more sidewalls.

8. The method of claim 7, further comprising applying a bias power to the substrate to deposit ammonium fluoride on the bottom surface of the one or more features.

9. The method of claim 8, wherein the one or more features have an aspect ratio of at least about 10:1.

10. The method of claim 1, further comprising providing a second process gas to the processing volume prior to providing the first process gas.

11. The method of claim 10, wherein the second process gas is an inert gas.

12. The method of claim 11, further comprising igniting the inert gas to form a plasma.

13. The method of claim 12, wherein exposing the first layer of the substrate to the ion species further comprises maintaining the substrate at a first temperature of greater than about 70 degrees Celsius to form the ammonium fluoride film atop the first layer.

14. A method of processing a substrate disposed atop a substrate support in a processing volume of a processing chamber, comprising:
    exposing the substrate to a plasma formed from a second process gas comprising an inert gas;

after exposing the substrate to a plasma formed from a second process gas, generating an ion species from an inductively coupled plasma formed within the processing volume of the processing chamber from a first process gas comprising ammonia ($NH_3$), nitrogen trifluoride ($NF_3$), and an inert gas, wherein the inductively coupled plasma is formed in the same processing volume as the substrate without a chamber component disposed between the inductively coupled plasma and the substrate;

exposing a first layer of the substrate to the ion species to form an ammonium fluoride ($NH_4F$) film atop the first layer while maintaining the substrate at a first temperature of greater than about 70 degrees Celsius to form the ammonium fluoride film atop the first layer, wherein the first layer comprises silicon oxide; and heating the substrate to a second temperature at which the ammonium fluoride film reacts with the first layer to selectively etch the silicon oxide.

15. A non-transitory computer readable medium, having instructions stored thereon which, when executed, cause a process chamber to perform a method of processing a substrate disposed atop a substrate support in a processing volume of a processing chamber, the method comprising:

generating an ion species from an inductively coupled plasma formed within the processing volume of the processing chamber from a first process gas, wherein the inductively coupled plasma is formed in the same processing volume as the substrate without a chamber body disposed between the inductively coupled plasma and the substrate, wherein the inductively coupled plasma is formed by providing radio frequency (RF) power to ignite the first process gas, and wherein the RF power is pulsed to pulse the plasma;

exposing a first layer of the substrate to the ion species to form an ammonium fluoride ($NH_4F$) film atop the first layer, wherein the first layer comprises silicon oxide; and heating the substrate to a second temperature at which the ammonium fluoride film reacts with the first layer to selectively etch the silicon oxide.

16. The non-transitory computer readable medium of claim 15, wherein the first process gas comprises ammonia ($NH_3$) and nitrogen trifluoride ($NF_3$).

* * * * *